United States Patent [19]

Wright et al.

[11] Patent Number: 4,633,584
[45] Date of Patent: Jan. 6, 1987

[54] ACCURATE POSITIONING OF SOLID COMPONENTS FOR A ROBOTIC PICKUP

[75] Inventors: Steven F. Wright, Glen Ellyn; Eric J. Stenstrom, Park Ridge; Joseph Wolyn, Gurnee, all of Ill.

[73] Assignee: Molex Incorporated, Lisle, Ill.

[21] Appl. No.: 703,356

[22] Filed: Feb. 20, 1985

[51] Int. Cl.$^4$ .............................................. H05K 3/30
[52] U.S. Cl. ........................................ 29/834; 29/741; 29/759
[58] Field of Search ................ 29/834, 837, 739, 741, 29/759; 414/222, 225; 901/7

[56] References Cited

U.S. PATENT DOCUMENTS

| | | | |
|---|---|---|---|
| 4,203,698 | 5/1980 | Dupuis | 29/739 X |
| 4,212,102 | 7/1980 | Drinkard, Jr. | 29/759 X |
| 4,250,615 | 2/1981 | Knuth et al. | 29/834 X |
| 4,367,584 | 1/1983 | Janisiewicz et al. | 29/837 |
| 4,439,917 | 4/1984 | Pearson | 29/741 X |
| 4,528,747 | 7/1985 | Hoffman et al. | 29/834 |

Primary Examiner—Howard N. Goldberg
Assistant Examiner—Carl J. Arbes
Attorney, Agent, or Firm—Louis A. Hecht

[57] ABSTRACT

Several embodiments of a method and apparatus for accurately positioning solid components for a robotic pickup mechanism having a floating gripper head, are described. In a first arrangement, connectors are transported along a guide track, with linear arrays of solid projections depending from each connector received in slots formed in the track. Conveyance of the connector is completed when a leading projection contacts an accurately positioned stop wall located in one of the projection receiving slots. An alignment bar, generally coextensive with the linear array of solid projections, presses the projections against a track wall communicating with the slot. In a second arrangement, a gauge block is elevated to receive the solid projections of the connector, and is thereafter translated to a final loading position adjacent a robotic pickup mechanism. In a third embodiment, a shuttle mechanism for use with a gauge block is disclosed. The shuttle mechanism includes latching arms for retaining the connector against the upper movement of the gauge block, the latch arms being pivotable to clear the top surface of the connector, allowing presentation of the connector to a component pickup apparatus.

8 Claims, 9 Drawing Figures

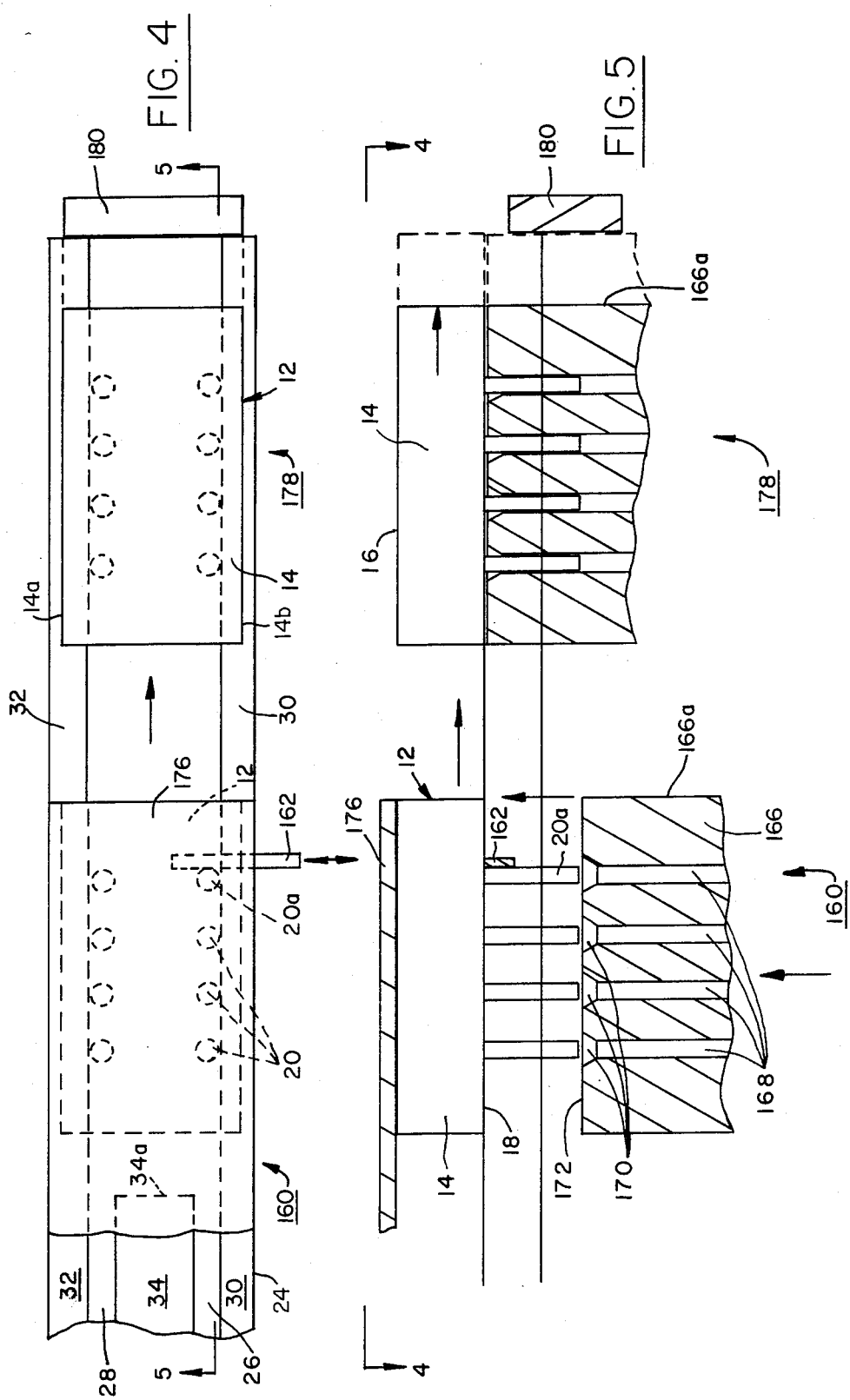

ACCURATE POSITIONING OF SOLID COMPONENTS FOR A ROBOTIC PICKUP

BACKGROUND OF THE INVENTION

1. Field of the Invention:

This invention relates to an apparatus and method for aligning solid components having rigid projections in preparation for pickup of the solid component by a robotic mechanism. More particularly, it relates to an apparatus and method that maintains an alignment with solid components having rigid projections depending therefrom, in three dimensional space, while independently grasping external surfaces of the solid component for pickup and placement at a remote location.

2. Discussion of the Prior Art:

The present invention pertains to the automated robotic placement of solid components at an accurately determined location. Since the placement accuracy of many robotic insertion heads is directly related to the accuracy of positioning the robotic head during pickup of the solid component, convenient, accurate alignment techniques, compatible with an automated pickup process, are necessary.

One example of a solid component being robotically placed, is an electrical connector of the type having a dielectric body, with one or more arrays of outwardly extending metallic terminal pins mounted therein. For a totally automated placement of such connectors, an accumulation of placement inaccuracies must be considered, and the sum total of all such inaccuracies must be carefully controlled. For example, the terminals of such connectors are typically inserted in mounting holes drilled in a printed circuit board. In a fully automated precess, a robotic pickup and insertion head would acquire a connector from a remote source such as a tray or the like, would move to a position on the printed circuit board, and would lower a predetermined amount, thereby inserting the connector terminals in the mounting holes of the printed circuit board. However, with the increasing number of leads required in connectors, the closer spacing between leads and the closer spacing of components on the printed circuit board, it is becoming increasingly difficult to position each terminal of an array of a large number of closely spaced terminals in the array of mounting holes in the printed circuit board.

In addition to inaccuracies of positioning successive printed circuit boards relative to a robotic insertion head, the inaccuracies of robotic movement from origin to destination, and the inaccuracies of the location of mounting holes relative to printed circuit board positioning holes, there is an inaccuracy in the position of connector terminals relative to the housing edge surfaces which are typically engaged by a robotic gripper head. The aggregate effect of these inaccuracies renders it difficult to insert all the leads of a connector into all of the printed circuit board mounted holes simultaneously, without causing damage to the leads or to the mounting holes.

When loading connector terminals in a connector housing, it is possible to maintain their precise location with respect to each other with a fairly high degree of accuracy. Unfortunately, however, the position of the connector terminals with respect to external edge surfaces of the connector housing may vary significantly from connector to connector. In the past, attempts to automatically align the pins of the connector to the printed circuit board have used the external edges connector housing as the reference for alignment. Since the terminals have a potential error in placement with respect to the connector housing, they also have a potential error in placement with respect to the mounting holes. Hence, the common technique used in the prior art to align the terminals to the mounting holes is to place the connector on the printed circuit board so that terminals of the connector are approximately aligned with the mounting holes. Final alignment is accomplished by an additional automated process or manually, by an operator.

One example of an alignment apparatus and method for use with an automated assembly process, is described in U.S. Patent No. 4,479,298. The patent addresses the need of accurately positioning the various wafer-like stages of an integrated circuit (IC) package assembly. The technique used requires an alignment fixture, comprising a coarse alignment pedestal mounted on a fine alignment block, for receiving the IC package and aligning the leads thereof with respect to a two dimensional reference coordinate system. The leads of the package, however, are of a surface mount type, having solder pads extending parallel to the wafer-like body. The arrangement disclosed is for fixing the location of the leads, relative to the remainder of the IC package, and does not address the need for accurately positioning a component in three dimensional space in preparation for pickup by a robot arm or the like automated assembly technique.

United Kingdom patent application 2,131,331 describes a technique to aid in the robotic placement of a plurality of different shaped components on a printed wiring board. The technique uses a template designed for use with a particular printed wiring board, having accurately dimensioned openings for rceiving the plurality of electronic components. To aid in seating the components in the template and to aid introducing the leads thereof into the mounting holes of the printed wiring board, and template and board are vibrated. This technique is not concerned with the accurate pickup of a component with a robotic arm, since it compensates for any inaccuracies by using the template to guide the components after they are robotically placed at their final destination.

U.S. Pat. No. 4,459,743 describes a technique for the automatic mounting of chip components, stored in a parts hopper, for placement on a printed circuit board. The system uses a combination of X direction and Y direction shuttle mechanisms. The components are conveyed downwardly along a sliding track, with the outermost projecting surface thereof coming to rest against a stopper member. Thereafter, the part is conveyed to the X-Y conveyance apparatus.

U.S. Pat. No. 4,470,182—Zemek et al, discloses an arrangement for centering electrical components that are mounted on a paper tape substrate. The arrangement displaces the components along their longitudinal centerlines, in a direction perpendicular to the axis of the paper tape substrate. The arrangement uses a pair of spaced apart arms which come together, to provide an automatic centering of the components, relative to the centerline of the arm mechanism.

It is therefore apparent that a need exists in the art for an apparatus and method to accurately align the terminals of an electrical connector to the mounting holes of a printed circuit board to which the connector is to be mounted. Such an apparatus and method, if compatible with automated robotic insertion techniques would not only lower the manufacturing costs but also would improve the quality of the electronic device produced.

SUMMARY OF THE INVENTION

It is therefore an object of the present invention to provide a method and apparatus to align the terminals of an electrical connector with respect to the mounting holes of a printed circuit board to which the connector is to be mounted.

Another object of the present invention is to provide a method and apparatus that is compatible with automated robotic manufacturing processes.

A further object of the invention is to provide a method and apparatus that maintains the desired position between the connector terminals and printed circuit board mounting holes thorughout the pickup and placement of a connector by a robotic insertion head.

These and other objects of the present invention are provided in an improved method of accurately positioning a solid body from a loading station to a remote mounting station on a mounting surface by means of a robotic arm. The body has an external surface defined between a pair of opposed external edges, and at least one linear array of projections having a predetermined configuration depending from said external surface located between said external edges. The mounting surface includes a linear array of projection-receiving apertures having a configuration corresponding to that of said linear array of said projections. The robotic arm has a head which engages said external edges of said solid body, to pick up and thereby withdraw said solid body from said loading station, moving said solid body to said remote mounting station so as to overlie said array of projection-receiving apertures, and lowering said solid body so as to insert said solid projections in said apertures. The improvement comprises the steps of:

positioning the linear array of projections along a reference line a-b having a configuration corresponding to that of said linear array of projections, where a is a position of a lead projection;

positioning the head to overlie said connector at a given orientation with respect to said reference line;

gripping said edges of said solid body independent of the orientation of said head;

raising said arm and withdrawing said solid body from said loading station, and moving said solid body to said mounting station;

orienting said head such that said projections overlie and are aligned with said linear array of mounting holes; and lowering said head and inserting said solid projections in said apertures.

An important feature of the present invention is provided by an improved apparatus for accurately positioning a solid body from a loading station to a remote mounting station on a mounting surface by means of a robotic arm. The body has an external surface defined between a pair of opposed external edges, and at least one linear array of projections having a predetermined configuration depending from said external surface located between said external edges. The mounting surface includes a linear array a projection-receiving apertures having a configuration corresponding to that of said linear array of said projections. The robotic arm has a head which engages said external edges of said solid body, means to pick up and thereby withdraw said solid body from said loading station, means for moving said solid body to said remote mounting station so as to overlie said array of projection-receiving apertures, and means for lowering said solid body so as to insert said solid projections in said apertures. The improvement comprises:

means for positioning said linear array of projections along a reference line a-b having a configuration corresponding to that of said linear array of projections, where a is a position of a lead projection;

means for positioning the head to overlie said connector at a given orientation with respect to said reference line;

means for gripping said edges of said solid body independent of the orientation of said head;

means for raising said arm and withdrawing said solid body from said loading station, and for moving said solid body to said mounting station;

means for orienting said head such that said projections overlie and are aligned with said linear array of mounting holes; and means for lowering said head and inserting said solid projections in said apertures.

BRIEF DESCRIPTION OF THE DRAWINGS

In the drawings, wherein like elements are referenced alike,

FIG. 4 is a plan view of an alternative embodiment of the present invention;

FIG. 5 is a cross-section elevation view taken along the lines 5—5 of FIG. 4;

FIG. 9 is a plan view of the arrangement of FIG. 8.

DETAILED DESCRIPTION OF PREFERRED EMBODIMENT

Figure 1:
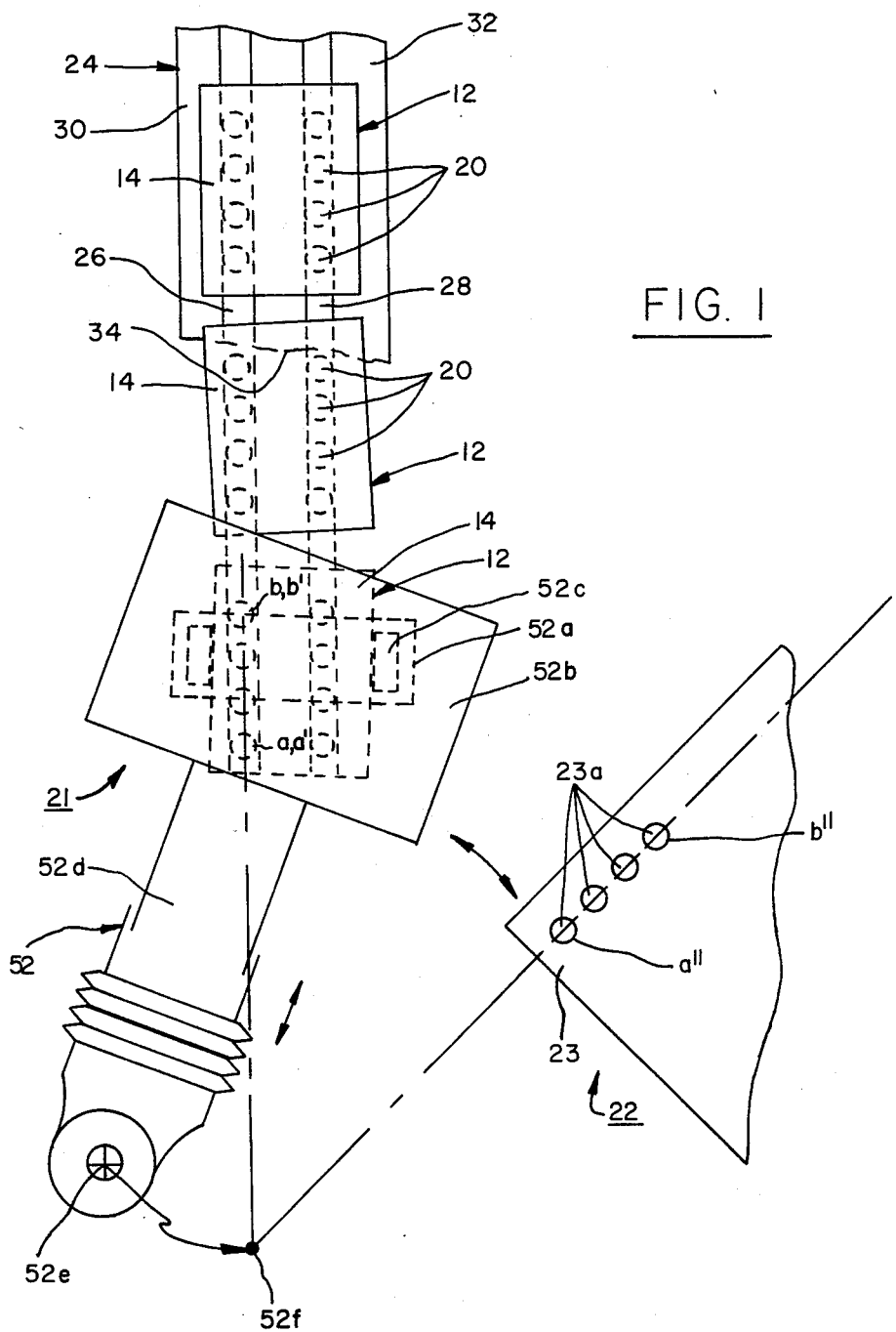
FIG. 1 illustrates principle features of the present invention by showing in plan view, robotic insertion mechanism which accurately positions electrical components between component pickup and placement stations.

Referring now to the drawings, FIG. 1 is a plan view of a component loading station 21, a component mounting station 22, and a robotic insertion mechanism 52 which transports solid components between the two stations. The solid components being moved between the stations are of a type having solid projections extending from an external surface thereof. An example of this type of component is illustrated in the figures as an electrical connector 12. Connector 12 (see FIGS. 2 and 3) has a solid dielectric body 14, with an upper surface 16, and a lower support surface 18, and two linear arrays of metallic terminals or solid projections 20 depending from surface 18. As is known in the art, connector 12 is conveyed along a feed track 24 comprising two spaced apart projection-receiving slots 26, 28 formed between outside track walls 30, 32 and a medial track wall 34. Track walls 30-32-34 each have upper surface designated by the subscript u, for contacting and slidingly supporting the support surface 18 of connector bodies 14.

Referring again to FIG. 1, it can be seen that the linear arrays of projections 20 of each connector 12 are maintained in fairly close alignment with projection receiving track 26. However, the dielectric bodies 14 of each connector are not maintained in such alignment, as is shown in FIG. 1, to a greatly exagerrated extent for the purposes of illustration. The method and apparatus of the present invention provides a technique for accurately positioning the terminals 20 with respect to the terminal receiving apertures 23a in a printed circuit board or the like mounting surface 23, in a single "pick and place" operation.

Figure 2:
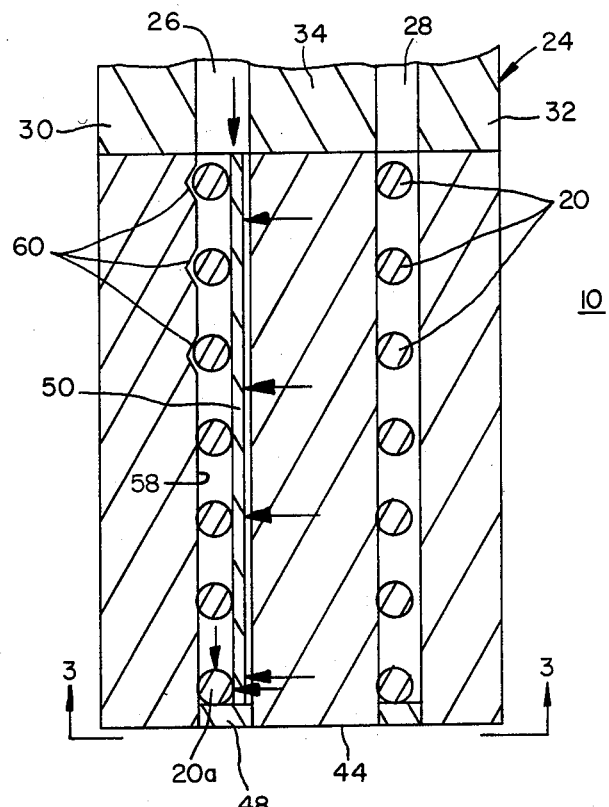
FIGS. 2 and 3 are enlarged, fragmentary top plan and end elevation views, respectively illustrating a first embodiment of the present invention.
Figure 3:
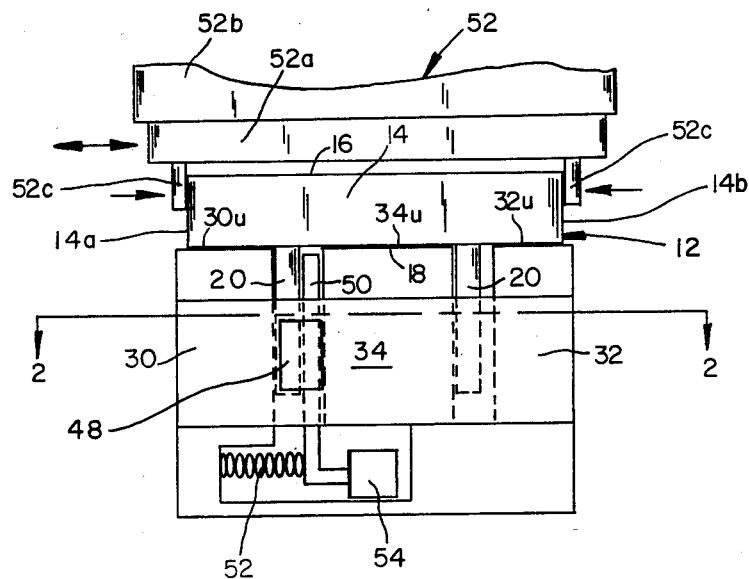

Referring to FIGS. 2 and 3, one embodiment of the locating apparatus of the present invention, generally designated at 10, comprises an extended section of track 24 having a free end 44. The upper support surfaces of apparatus 10 are accurately positioned to provide the correct placement height for connector 12. A stop wall 48 is provided in track 26 adjacent the free end 44 of apparatus 10, being positioned to contact only a leading projection (designated 20a in FIGS. 2 and 3), avoiding contact with connector body 14. Stop wall 48 provides a first accurate positioning of leading projection 20a, in the plane of FIG. 2, which is independent of the relative position between projection 20a and connector body 14.

Also located in track 26, is a moveable alignment bar 50, generally coextensive with the linear array of projections 20. Initially, bar 50 is positioned immediately adjacent medial track wall 34 to provide clearance for the projections 20, ensuring engagement between leading projection 20a and stop wall 48. The initial position of bar 50 is provided by a plurality of release springs 52 which urge bar 50 against medial track wall 34. Upon engagement of the leading projection 20a with stop wall 48, solenoid 54 is energized to move alignment bar 50 toward outside track wall 30, which includes a reference surface 58 communicating with track 26. Movement of alignment bar 50 causes the linear array of projections 20 to be pressed against surface 58, thereby providing a second accurate positioning of leading projection 20a in the plane of FIG. 2, owing to the accurate positioning of reference surface 58, formed parallel to the longitudinal axis of track 24. When fully seated in track 26, at its forwardmost position, the leading projection 20a of connector 12 is confined by three surfaces: track wall reference surface 58, stop wall 48, and alignment bar 50, to accurately position the leading projection 20a in the plane of FIG. 2. With the upper surfaces of the track walls also being accurately positioned, projection 20a is accurately fixed in three dimensional space.

To review the alignment afforded by the present invention, connectors 12 have a linear array of projections 20 depending therefrom. These projections are to be received in the mounting apertures 23a formed in the mounting surface of a printed circuit board 23. The linear array of apertures 23a has the same configuration as the linear array of terminals 20, the problem being to provide an accurate pickup and placement of the array of terminals with respect to the array of apertures 23a. Connectors 12 are advanced along a track 24 until they reach a loading station 21, whereupon the linear array of projections 20 is positioned along a reference line a-b located in track 26, where a corresponds to the position of the leading projection 20a. With the array of terminals 20 being fixed in space, a robotic arm-like pickup mechanism 52 is brought into alignment with line a-b.

Robotic mechanism 52 includes an a lowering floating gripper head 52a which mounted for independent "floating" movement with respect to an upper placement arm 52b. Gripper head 52a includes gripper-like fingers 52c which engage edge surfaces of connector body 14. Placement arm 52b has defined therein a reference line a'-b' having the same configuration as reference line a-b. As can be seen in FIG. 1, placement arm 52b is mounted for pivotable movement at 52e and is capable of telescopic extension, provided by a telescoping mechanism 52d. Robotic mechanism 52 is of a type well known in the art, capable of precisely repeating a programmed path of movement. The path of robotic movement is programmed to position pivot mounting 52e at point 52f, and to align reference line a'-b' of placement arm 52b with line a-b of loading station 21. The floating gripper head 52a is programmed for independent movement (with respect to arm 52b) to straddle the gripper arms 52c across opposed edges of connector body 14. Robot arm 52b is programmed for upward movement to withdraw connector 12 from loading station 21. Thereafter, mechanism 52 is programmed to move connector 12 to mounting station 22, located on the surface of printed circuit board 23. Connector 12 is positioned to overlie apertures 23a with robotic reference line a'-b' being aligned congruent to the mounting reference line a"-b", which in turn is congruent with the linear array of projection receiving apertures 23a.

When employed with the positioning arrangement of the present invention, the robotic pickup arm 52b maintains its precise alignment with leading projection 20a, while the floating gripper head 52a is automatically and independently moved small amounts to facilitate engagement between its arms 52c and the opposed external surfaces 14a, 14b of connector body 14, wherever those surfaces might lie. Thus, the floating gripper head 52a compensates for any inaccuracies in the relative positioning between projections 20 and the outside surfaces 14a, 14b of connector body 14. After the arms 52c of gripper head 52a have engaged connector body 14 (with accurate positioning of leading projection 20a being assured), solenoid 54 is de-energized and bar 50 returns to its original position adjacent medial wall 34, under the bias force of release springs 53. The robotic pickup mechanism 52 is thereafter withdrawn away from the plane of FIG. 2, so as to remove connector 12 from positioning apparatus 10. The next connector 12 in a serial array of connectors is then loaded in apparatus 10 for accurate presentation to the robotic pickup mechanism.

If desired, projection receiving and straightening recesses 60 may be formed in reference surface 58 to aid in aligning and straightening the projections with respect to each other and with respect to the reference surface 58. Only a few of the recesses 60 are shown on FIG. 2, for the purpose of clarity. However, in the preferred embodiment, all of the projections have corresponding recesses 60. The important object accomplished by the present invention is the accurate positioning of projections 20 relative to a robotic pickup mechanism, as opposed to prior art techniques of aligning the external connector body surfaces to the pickup mechanism.

Referring now to FIGS. 4-5, an alternative embodiment of the present invention also provides accurate positioning of an electrical connector or the like solid component 12 in three dimensional space. Connector 12 is conveyed along feed track 24 for presentation to a first positioning station, generally designated at 160. Track 24 is substantially identical to that described above with reference to FIGS. 2 and 3, except medial wall 34 is terminated at a free end 34a located upstream of station 160.

Station 160 is defined in part by a retractable positioning finger 162 which projects into track 26 to engage the leading projection 20a of connector 12. At station 160, connector 12 is held in a vertical position by track walls 30, 32, which are dimensioned to provide clearance for reception of a gauge block 166 therebetween.

Gauge block 166 is of a type having an upper wall 172° defining a plurality of accurately dimensioned, close tolerance projection-receiving apertures 168 communicating with funnel-shaped entrance portions 170. Apertures 168 are arranged in two linear arrays, corresponding to the desired configuration of the serial arrays of projections 20, in connector 12. As is known in the art, gauge block 166 when applied to projections 20, straightens any bends or other malformation in projections 20, providing the desired configuration for the projections, as well as the desired spacing between projections. Gauge block 166 is provided with a mounting, not shown in the figures, for accurate positioning in three dimensional space. Thus, in addition to providing the usual correction to projections 20, gauge block 166 is employed in the present invention to provide an extremely accurate positioning of those projections, for presentation to a robotic pickup mechanism or the like automated positioning apparatus.

As connector block 166 is upwardly advanced, projections 20 are received within slots 168 to fix those projections accurately in the plane of FIG. 4. An upper stop wall 176 is positioned to overlie the upper surface 16 of connector 12, to balance the upward force generated by the frictional engagement between porjections 20 and slots 168 of gauge block 166. After projections 20 are fully received in slots 168, gauge block 166 (with the connector 12 engaged therewith), is advanced in a rightward direction to assume the final loading station 178 shown in the righthand portions of FIGS. 4 and 5. Loading station 178, which corresponds to station 21 of FIG. 1, is defined by a block 180 which engages the leading end 166a of gauge block 166 to define a final, accurately determined position in the plane of FIG. 3.

Driving mechanisms for raising gauge block 166 can, as is known in the art, be provided with an accurately defined upper limit so as to accurately position the upper surface 172 of gauge block 166. Thus, connector 12, in its final loading station 178, is accurately positioned in three dimensional space, and is made accessible to the robotic pickup mechanism 52 (not shown) located above track 24. With the projections 20 of connector 12 being accurately placed, the pickup position of the robotic mechanism can be accurately and precisely aligned with the final loading station.

With projections 20 being accurately fixed at loading station 178, and thereby being aligned with a robotic pickup mechanism, the floating gripper head 52a can be lowered to engage the outer surfaces 14a, 14b of connector body 14. The driving mechanism for raising gauge block 166 holds the gauge block fixed while connector 12 is lifted out of the gauge block by the robotic pickup mechanism 52. Thereafter, gauge block 166 can be returned to its initial positioning station 160 for presentation of another connector 12 in a serial array of connectors carried along track 24. With the present invention, any variation in the relative location of projections 20 with respect to external surfaces 14a, 14b can be automatically compensated by the various floating gripper head arrangements in use today.

It has been assumed in the discussion above, that the solid projections 20 are rigidly fixed in connector body 14. However, other types of connectors have terminals loosely positioned in the connector body. The degree of freedom of these terminals is significantly greater than the tolerance required for robotic placement on a printed circuit board. The arrangement of the present invention, when employed with a robotic gripper mechanism having arms which also engage projections 20 adjacent the support surface 18 of connector body 14, can provide a close tolerance simultaneous placement of all projections 20 of a given linear array, in a linear array of printed circuit board mounting holes.

Turning now to FIGS. 6–9, another alternative embodiment of the locating apparatus of the present invention, designated generally at 210, is shown. Track 24 is substantially identical to the guide tracks described above, except that a necked-down portion 234 is aligned with intermediate wall 34 to provide a smooth transition with a guide bar 260 of reduced width. As connector 12 slides along track 24, it is supported in its upstream position by track walls 30-32-34. Upon reaching the final loading station of FIGS. 6–9, it is supported from below by guide bar 260 and by longitudinally extending moveable bars or follower plates 300 which prevent connector 12 from tipping sideways, or becoming dislodged from guide bar 260. A groove 18a formed in support surface 18 of connector body 14 receives the upper portion of guide bar 260, to aid in maintaining the desired orientation of connector 12 in the article a apparatus 210.

Figure 8:
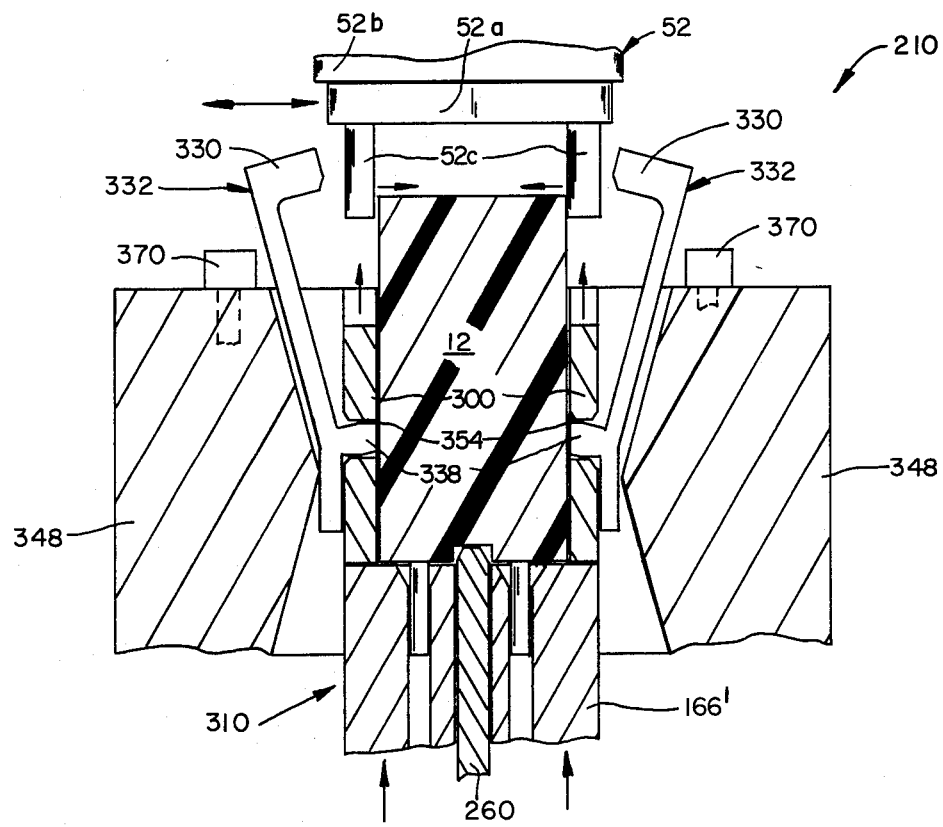
Figure 9:
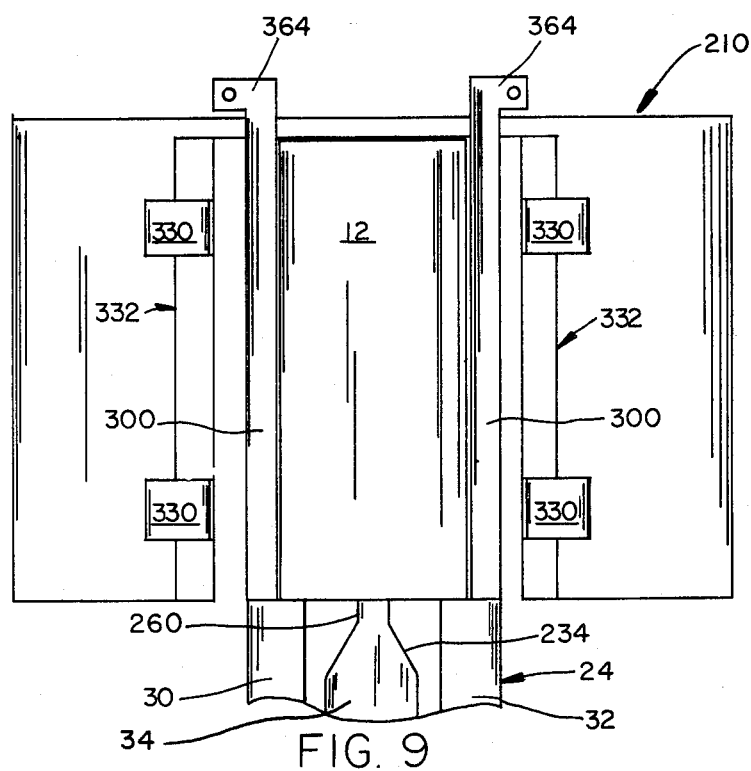
FIG. 9 shows the arrangement of FIG. 6 in its final position, ready for withdrawal by a robotic insertion head.

A shuttle assembly, designated generally at 310, provides the final delivery of connector 12 to the loading position shown in FIG. 8, for presentation to a floating gripper head 52a of a robotic pickup mechanism 52. Shuttle 310 includes a gauge block 166' substantially identical to gauge block 166 previously described, but for a vertically extending slot 316 which receives guide bar 260.

Gauge block 166' is accurately positioned by a stop wall 320 which abuts one end 266a of gauge block 166', in sliding engagement therewith. As gauge block 166' is raised, it engages connector projections 20 in accurately dimensioned apertures 68 having funnel shaped openings 70. During elevation of gauge block 166', connector 12 is restrained against upward movement by retaining fingers 330 formed at the upper end of latch arms 332. Latch arms 332 include a vertically extending beam member 336 having a pivotal mounting projection 338 and an outwardly extending cam arm 342 formed at its lower end. Beam members 336 and outwardly extending cam arms 332 together present a continuous camming surface 344 to stationary cam blocks 348 having a fulcrum point 350. Projections 338 are received in apertures 354 formed in follower plates 300 to provide a pivotal mounting for latch arms 332.

As gauge block 166' is raised, its upper surface 167 contacts the bottom mounting surface 18 of connector 12, as well as the bottom free end of follower plates 300. Further upward movement of gauge block 166' causes connector 12, follower plates 300, and latch arms 332 to be elevated as a single unit, once projections 20 are fully received in gauge block apertures 68.

Figure 6:
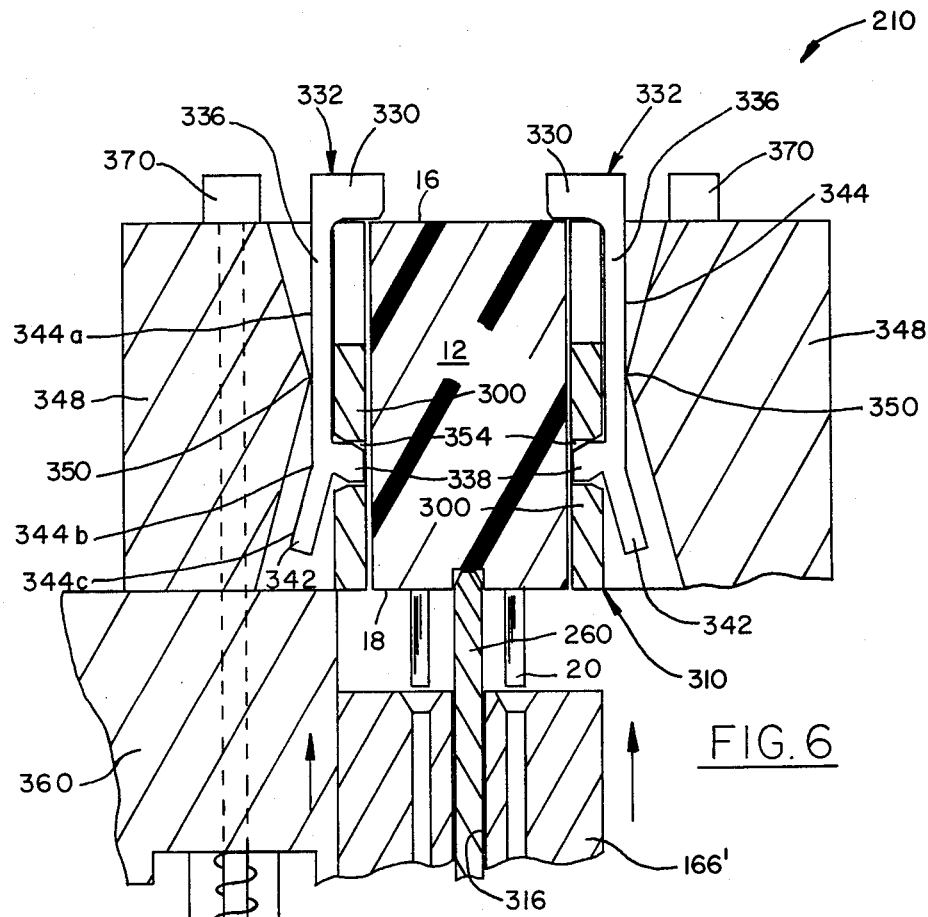
FIG. 6 is a cross-section elevation view of another alternative embodiment of the present invention shown prior to positioning of an electrical connector, taken along the lines 6—6 of FIG. 7.
Figure 7:
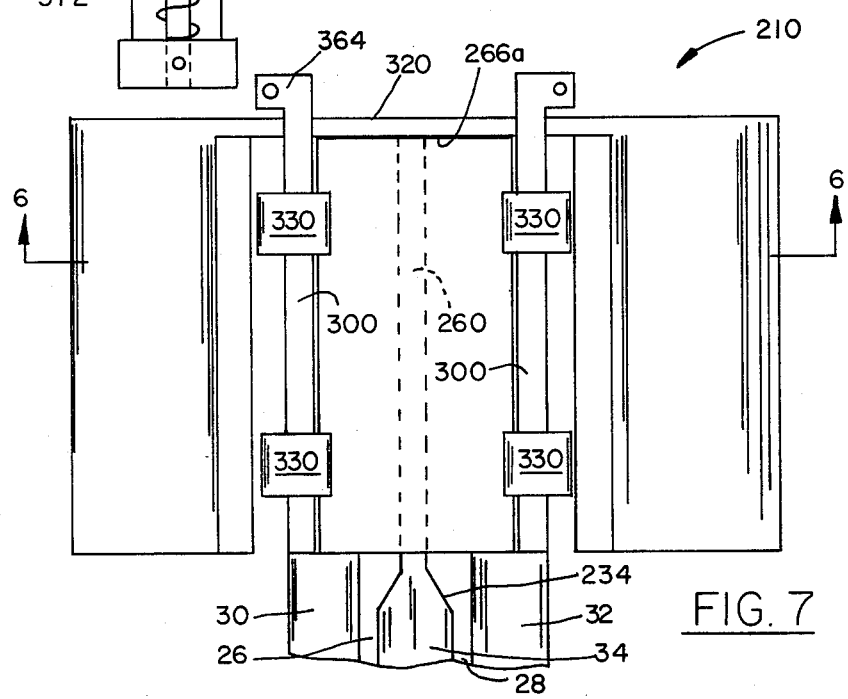
FIG. 7 is a plan view of the arrangement of FIG. 6.

As can be seen in FIG. 6, cam blocks 348 are formed as an extension of a mounting base 360. Latch arms 332 further include tab-like extensions 364 which are biased in a downward direction, owing to their engagement with spring loaded pin 370 which projects beyond the lower portion of mounting base 360. A spring 372 biases pin member 370, providing the downward spring force imparted to latch arms 332, which maintains engagement between retaining fingers 330 and the top surface 16 of connector body 14. As gauge block 66 is elevated, latch arms 332 undergo two distinct motions, owing to the configuration of their camming surface 344. Initially, fulcrum points 350 of stationary cam blocks 348 engage the upper portions 344a of cam surface 344, ensuring engagement between retaining fingers 330 and the upper surface 16 of connector body 14. As the transition point 344b of cam surface 344 is elevated to contact fulcrum 350, latch arms 332 begin an outward pivotable deflection, eventually achieving the position shown in FIG. 8. As indicated in FIG. 8, clearance is provided to allow the fingers 52c of robotic floating gripper head 52a to engage the upper end of connector 12 for subsequent withdrawal of the connector from the shuttle assembly mechanism 310.

Thereafter, gauge block 166' is lowered to its initial position, latch arms 332 are drawn together, and another connector 12 is inserted into apparatus 210. Fingers 330 prevent bowing of connector 12 as it rebounds against stop wall 320. As before, the driving mechanism which lifts the shuttle assembly holds the gauge block fixed during withdrawal of connector 12 therefrom.

We claim:

1. A method of accurately positioning a solid body from a loading station to a remote mounting station on a mounting surface by means of a robotic arm, said body having an external surface defined between a pair of opposed external edges, and at least one linear array of projections having a predetermined configuration depending from said external surface located between said external edges, said mounting surface including a linear array of projection-receiving apertures having a configuration corresponding to that of said linear array of said projections, said robotic arm having a head which engages said external edges of said solid body, a pick up and thereby withdraw said solid body from said loading station, moving said solid body to said remote mounting station so as to overlie said array of projection-receiving apertures, and lowering said solid body so as to insert said solid projections in said apertures, wherein the improvement comprises:

positioning said linear array of projections along a reference line a-b having a configuration corresponding to that of said linear array of projections, where a is a position of a lead projection;

positioning the head to overlie said connector at a given orientation with respect to said reference line;

gripping said edges of said solid body independent of the orientation of said head;

raising said arm and withdrawing said solid body from said loading station, and moving said solid body to said mounting station;

orienting said head such that said projections overlie and are aligned with said linear array of mounting holes; and lowering said head and inserting said solid projections in said apertures.

2. The method of claim 1 wherein the step of positioning said linear array of projections along a line 1-b, where a is the position of the lead terminal, comprises the steps of:

positioning said lead projection against a stop wall defining said position a; and positioning said linear array of projections laterally against a straight reference surface defining said line a-b.

3. The method of claim 1 wherein said step of positioning said linear array of projections along a line a-b, where a is the position of the lead terminal, comprises:

positioning a gauge block beneath said body, said gauge block having an upper surface defining a linear array of projection-receiving gauging apertures having a configuration corresponding to said linear array of mounting apertures;

moving said gauge block toward said solid body so as to engage and receive said solid projections therein; and positioning said gauge block so that said linear array of gauging apertures are congruent to said line a-b.

4. The method of claim 3 wherein said step of withdrawing said connector from said loading station comprises the step of fixing said gauge block in a predetermined position, and moving said body so as to withdraw said projections therefrom.

5. The method of claim 1 wherein said straight reference surface includes an accurately dimensioned linear array of projection receiving and straightening recesses formed in said reference surface, and said positioning step including the step of aligning said projections with respect to each other and with respect to said reference surface.

6. The method of claim 3 further comprising the step of, subsequent to said engagement of said projections with said gauge block, advancing said gauge block to said loading station.

7. The method of claim 3 further including the step of restraining the upper surface of said solid body against movement away from said gauge block as said gauge block engages said solid projections.

8. The method of claim 7 further comprising the step of advancing said gauge block with said solid projections engaged therein, from a first position upwardly to a second release position adjacent said loading station, where said solid body is freed for upward withdrawal.

* * * * *